United States Patent
Kumar et al.

(10) Patent No.: US 11,453,063 B2
(45) Date of Patent: Sep. 27, 2022

(54) MULTILAYER NITRIDE HARD COATINGS

(71) Applicant: Kennametal Inc., Latrobe, PA (US)

(72) Inventors: Vineet Kumar, Latrobe, PA (US);
Ronald Penich, Greensburg, PA (US);
Chen Chen, Latrobe, PA (US); Zhenyu Liu, Greensburg, PA (US); Nicholas F. Waggle, Jr., Derry, PA (US)

(73) Assignee: KENNAMETAL INC., Latrobe, PA (US)

( * ) Notice: Subject to any disclaimer, the term of this patent is extended or adjusted under 35 U.S.C. 154(b) by 147 days.

(21) Appl. No.: 16/783,798

(22) Filed: Feb. 6, 2020

(65) Prior Publication Data
US 2020/0173012 A1    Jun. 4, 2020

Related U.S. Application Data

(63) Continuation of application No. 15/610,110, filed on May 31, 2017, now Pat. No. 10,570,501.

(51) Int. Cl.
| | |
|---|---|
| *B23B 27/14* | (2006.01) |
| *C23C 14/06* | (2006.01) |
| *C23C 14/32* | (2006.01) |
| *C23C 28/00* | (2006.01) |
| *C23C 28/04* | (2006.01) |
| *C23C 14/02* | (2006.01) |

(52) U.S. Cl.
CPC ......... *B23B 27/148* (2013.01); *C23C 14/024* (2013.01); *C23C 14/0641* (2013.01); *C23C 14/325* (2013.01); *C23C 28/042* (2013.01); *C23C 28/42* (2013.01); *B23C 2224/24* (2013.01); *B23C 2228/08* (2013.01)

(58) Field of Classification Search
CPC ... B23B 27/14; B23B 27/148; C23C 14/0641; C23C 28/42; B23C 2224/24; B23C 2228/08
USPC .......................................................... 428/697
See application file for complete search history.

(56) References Cited

U.S. PATENT DOCUMENTS

| | | | |
|---|---|---|---|
| 5,494,635 | A | 2/1996 | Bennett |
| 5,976,707 | A | 11/1999 | Grab |

(Continued)

FOREIGN PATENT DOCUMENTS

| | | |
|---|---|---|
| CN | 101690978 A | 4/2010 |
| DE | 9400444 | 5/1994 |

(Continued)

OTHER PUBLICATIONS

May 12, 2021 Office Action (non-US) CN App. No. 108977808A.
(Continued)

*Primary Examiner* — Archene A Turner
(74) *Attorney, Agent, or Firm* — Larry R. Meenan (57) ABSTRACT

In one aspect, coatings are described herein employing composite architectures providing high aluminum content and high hardness for various cutting applications. For example, a coated cutting tool comprises a substrate and a coating comprising a refractory layer deposited by physical vapor deposition adhered to the substrate, the refractory layer comprising a plurality of sublayer groups, a sublayer group comprising a titanium aluminum nitride sublayer and an adjacent composite sublayer comprising alternating nanolayers of titanium silicon nitride and titanium aluminum nitride.

12 Claims, 3 Drawing Sheets

(56) References Cited

U.S. PATENT DOCUMENTS

| | | |
|---|---|---|
| 6,071,560 A | 6/2000 | Braendle |
| 6,077,596 A | 6/2000 | Hashimoto |
| 6,214,247 B1 | 4/2001 | Leverenz et al. |
| 6,274,249 B1 | 8/2001 | Braendle et al. |
| 6,432,219 B1 | 8/2002 | Wijngaard et al. |
| 6,523,732 B1 | 2/2003 | Popoola et al. |
| 6,586,122 B2 | 7/2003 | Ishikawa et al. |
| 6,712,564 B1 | 3/2004 | Hughes et al. |
| 6,737,178 B2 | 5/2004 | Ota |
| 6,844,069 B2 | 1/2005 | Braendle |
| 6,884,497 B2 | 4/2005 | Sulin |
| 7,410,707 B2 | 8/2008 | Fukui et al. |
| 7,544,024 B2 | 6/2009 | Omori et al. |
| 7,553,113 B2 | 6/2009 | Omori et al. |
| 7,592,076 B2 | 9/2009 | Flink |
| 7,713,612 B2 | 5/2010 | Hanyu et al. |
| 7,749,594 B2 | 7/2010 | Astrand |
| 7,767,319 B2 | 8/2010 | Åkesson |
| 7,794,860 B2 | 9/2010 | Okamura et al. |
| 7,799,415 B2 | 9/2010 | Moriguchi et al. |
| 7,837,416 B2 | 11/2010 | Omori |
| 7,838,132 B2 | 11/2010 | Ahlgren |
| 8,003,232 B2 | 8/2011 | Johansson |
| 8,003,234 B2 | 8/2011 | Omori et al. |
| 8,043,035 B2 | 10/2011 | Astrand et al. |
| 8,119,262 B2 | 2/2012 | Åstrand |
| 8,133,576 B2 | 3/2012 | Omori |
| 8,277,958 B2 | 10/2012 | Ni et al. |
| 8,283,058 B2 | 10/2012 | Mårtensson |
| 8,409,695 B2 | 4/2013 | Ni et al. |
| 8,409,696 B2 | 4/2013 | Johansson et al. |
| 8,409,702 B2 | 4/2013 | Ni et al. |
| 8,415,033 B2 | 4/2013 | Matsuzawa |
| 8,440,328 B2 | 5/2013 | Inspektor |
| 8,557,405 B2 | 10/2013 | Shibata et al. |
| 8,568,866 B2 | 10/2013 | Ni et al. |
| 8,623,525 B2 | 1/2014 | Waki et al. |
| 8,852,305 B2 | 10/2014 | Andersson et al. |
| 8,859,114 B2 | 10/2014 | Inspektor et al. |
| 8,945,251 B2 | 2/2015 | Waki et al. |
| 9,157,143 B2 | 10/2015 | Pettersson et al. |
| 9,579,728 B2 | 2/2017 | Sakamoto |
| 9,962,771 B2 | 5/2018 | Tanaka |
| 10,570,501 B2* | 2/2020 | Kumar .................. C23C 14/024 |
| 2002/0082596 A1 | 6/2002 | Buysse et al. |
| 2002/0136933 A1 | 9/2002 | Braendle |
| 2002/0182285 A1 | 12/2002 | Godwin et al. |
| 2003/0161695 A1 | 8/2003 | Grab et al. |
| 2005/0260454 A1 | 11/2005 | Fang et al. |
| 2006/0082859 A1 | 4/2006 | Huibers et al. |
| 2006/0095060 A1 | 5/2006 | Mayenberger et al. |
| 2006/0225553 A1 | 10/2006 | Hasegawa et al. |
| 2007/0148496 A1 | 6/2007 | Takaoka et al. |
| 2008/0124531 A1 | 5/2008 | Hanyu et al. |
| 2008/0196318 A1 | 8/2008 | Bost et al. |
| 2008/0226943 A1 | 9/2008 | Fang et al. |
| 2008/0286608 A1 | 11/2008 | Quinto et al. |
| 2010/0129165 A1 | 5/2010 | Hughes et al. |
| 2010/0263503 A1 | 10/2010 | Fontaine et al. |
| 2011/0045283 A1 | 2/2011 | Holzschuh et al. |
| 2011/0081539 A1 | 4/2011 | Ni et al. |
| 2011/0111197 A1 | 5/2011 | Johansson et al. |
| 2011/0120780 A1 | 5/2011 | Vezirian |
| 2011/0293909 A1 | 12/2011 | Ni et al. |
| 2012/0114436 A1* | 5/2012 | Andersson .......... C23C 14/0641 407/119 |
| 2012/0201615 A1 | 8/2012 | Ni et al. |
| 2012/0237792 A1 | 9/2012 | Inspektor et al. |
| 2012/0279372 A1 | 11/2012 | Kullmann et al. |
| 2013/0045059 A1 | 2/2013 | Bozkurt |
| 2013/0294849 A1 | 11/2013 | Heinloth et al. |
| 2014/0147683 A1* | 5/2014 | Arndt .................. C23C 14/0641 428/446 |
| 2014/0173995 A1 | 6/2014 | Bailey et al. |
| 2014/0272391 A1 | 9/2014 | Kumar |
| 2015/0050489 A1 | 2/2015 | Kumar et al. |
| 2015/0050490 A1* | 2/2015 | Kumar ................ C23C 14/0021 428/336 |
| 2015/0211105 A1 | 7/2015 | Schier et al. |
| 2015/0359638 A1 | 12/2015 | Khowaylo et al. |
| 2016/0032444 A1 | 2/2016 | Johnson et al. |

FOREIGN PATENT DOCUMENTS

| | | |
|---|---|---|
| DE | 19630791 A1 | 2/1998 |
| DE | 20207198 | 10/2002 |
| DE | 202009014144 | 3/2011 |
| EP | 3446814 A1 | 2/2019 |
| GB | 2326222 | 12/1998 |
| JP | 2000326107 | 11/2000 |
| JP | 2000326108 A | 11/2002 |
| JP | 3599628 B2 | 12/2004 |
| JP | 2011167793 | 9/2011 |
| JP | 2012-035377 * | 2/2012 |
| JP | 5962846 B2 | 8/2016 |
| WO | WO8902351 | 3/1989 |
| WO | WO2005121047 A1 | 12/2005 |
| WO | WO2010105608 | 9/2010 |
| WO | WO2015113866 | 8/2015 |

OTHER PUBLICATIONS

Paldey and Deevi, Single layer and multilayer wear resistant coatings of (Ti,Al)N: a review, Materials Science and Engineering A342 ELSEVIER, 2003, 58-79.

Navinsek et al, Industrial applications of CrN (PVD) coatings, deposited at high and low temperatures, Surface and Coatings Technology ELSEVIER, 1997, 182-191, 97.

Kumar and Penich, Stabilization of cubic phase in AlTiN coatings using anode configurations, International Journal of Refractory Metals and Hard Materials, 2016, doi: 10.1016/j.ijrmhm.2016.06.022.

Ducros et al, Multilayered and nanolayered hard nitride thin films deposited by cathodic arc evaporation. Part 1: Depositition, morphology and microstructure, Surface & Coatings Technology ELSEVIER, 2006, 136-142, 201.

Ducros et al, Multilayered and nanolayered hard nitride thin films deposited by cathodic arc evaporation. Part 2: Mechanical properties and cutting performances, Surface & Coatings Technology ELSEVIER, 2006, 1045-1052, 201.

Chang et al, Characteristics and performance of TiSiN/TiAlN multilayers coating synthesized by cathodic arc plasma evaporation, Surface & Coatings Technology ELSEVIER, 2007, 987-992, 202.

Cantero et al, Analysis of tool wear patterns in finishing turning of Inconel 718, Wear ELSEVIER SciVerse ScienceDirect, 2013, 885-894, 297.

Feb. 23, 2022 Notice of Allowance CN App. No. 108977808A.
Nov. 26, 2021 Foreign OA—CN App. No. 201810441937.0.
Apr. 9, 2020 Examination notification CN App. No. 108977808A.
Nov. 5, 2019 Notice of Allowance US App. No. 20180347027A1.
May 14, 2019 Office action (3 months) (US Only) US App. No. 20180347027A1.

* cited by examiner

FIG. 1

PVD IMAGE: FLAKING

PVD IMAGE: NO FLAKING

MULTILAYER NITRIDE HARD COATINGS

RELATED APPLICATION DATA

The present application is a continuation application pursuant to 35 U.S.C. § 120 of U.S. patent application Ser. No. 15/610,110 filed May 31, 2017.

FIELD

The present invention relates to multilayer nitride hard coatings and, in particular, to multilayer nitride hard coatings deposited by physical vapor deposition and comprising alternating nanolayers including titanium aluminum nitride and titanium silicon nitride.

BACKGROUND

One or more layers of refractory material are often applied to cutting tool surfaces by physical vapor deposition (PVD) techniques to increase properties including wear resistance, performance and lifetime of the cutting tool. Titanium nitride (TiN) coatings, for example, are commonly applied by PVD to cemented carbide cutting tool substrates. However, TiN begins oxidation at about 500° C. forming rutile $TiO_2$, thereby promoting rapid coating deterioration. Incorporation of aluminum into the cubic lattice can slow degradative oxidation of a TiN coating by forming a protective aluminum-rich oxide film at the coating surface.

While providing enhancement to high temperature stability, aluminum can also induce structural changes in a TiN coating having a negative impact on coating performance. Increasing amounts of aluminum incorporated into a TiN coating can induce growth of hexagonal close packed (hcp) aluminum nitride (AlN) phase, altering the crystalline structure of the coating from single phase cubic to a mixture of cubic and hexagonal phases. In some instances, aluminum content in excess of 70 atomic percent can further alter the crystalline structure of the AlTiN layer to single phase hcp. Significant amounts of hexagonal phase can lead to a considerable reduction in hardness of AlTiN, resulting in premature coating failure or other undesirable performance characteristics. Difficulties in controlling hexagonal phase formation can obstruct full realization of the advantages offered by aluminum additions to TiN coatings.

SUMMARY

In one aspect, coatings are described herein employing composite architectures providing high aluminum content and high hardness for various cutting applications. For example, a coated cutting tool comprises a substrate and a coating comprising a refractory layer deposited by physical vapor deposition adhered to the substrate, the refractory layer comprising a plurality of sublayer groups, a sublayer group comprising a titanium aluminum nitride sublayer and an adjacent composite sublayer comprising alternating nanolayers of titanium silicon nitride and titanium aluminum nitride. In some embodiments, the titanium aluminum nitride sublayer is of the formula $Ti_{1-x}Al_xN$, wherein $x \geq 0.68$. The coating adhered to the substrate, in some embodiments, further comprises one or more intermediate layers between the refractory layer and the substrate. An intermediate layer, for example, can comprise titanium aluminum nitride. In some embodiments, titanium aluminum nitride of the intermediate layer is of the formula $Ti_{1-z}Al_zN$, wherein $z \geq 0.68$. In other embodiments, z can be less than 0.68.

These and other embodiments are described in greater detail in the detailed description which follows.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, a coated cutting tool comprises a substrate and a coating comprising a refractory layer deposited by physical vapor deposition adhered to the substrate, the refractory layer comprising a plurality of sublayer groups, a sublayer group comprising a titanium aluminum nitride sublayer and an adjacent composite sublayer comprising alternating nanolayers of titanium silicon nitride and titanium aluminum nitride.

Turning now to specific components, coated cutting tools described herein comprise a substrate. A coated cutting tool can comprise any substrate not inconsistent with the objectives of the present invention. A substrate, in some embodiments, is an end mill, drill or indexable cutting insert. Indexable cutting inserts can have any desired ANSI standard geometry or non-standard geometry for milling, hole-making or turning applications. Substrates of coated cutting tools described herein can be formed of cemented carbide, carbide, ceramic, cermet or steel. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 3 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide cutting tool substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

Figure 1:
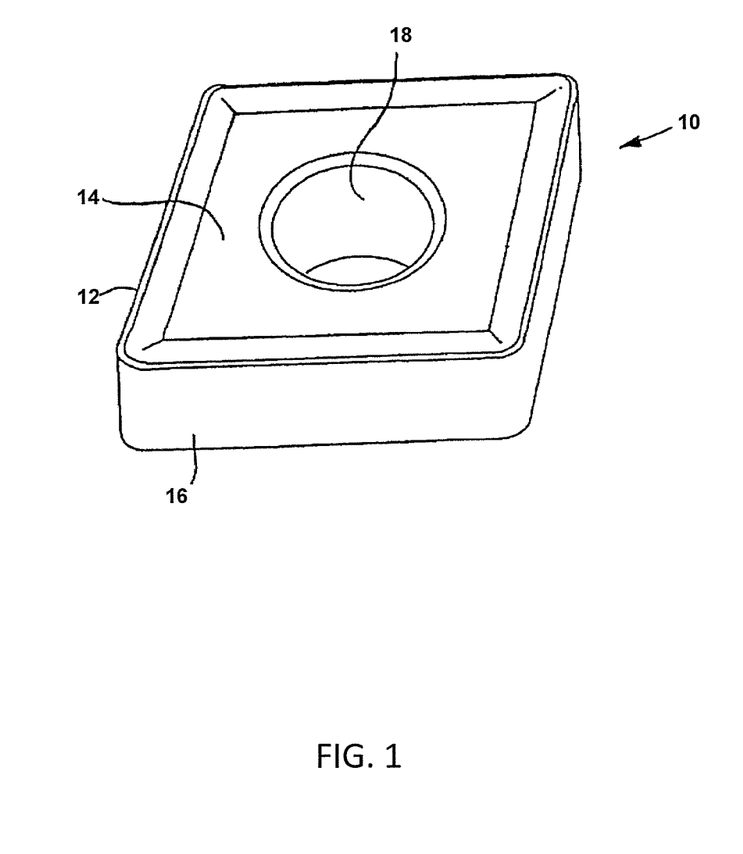
FIG. 1 illustrates a cutting tool substrate according to one embodiment described herein.

A cutting tool substrate can comprise one or more cutting edges formed at the juncture of a rake face and flank face(s) of the substrate. FIG. 1 illustrates a cutting tool substrate according to one embodiment described herein. As illustrated in FIG. 1, the substrate (10) has cutting edges (12) formed at junctions of the substrate rake face (14) and flank faces (16). The substrate (10) also comprises an aperture (18) for securing the substrate (10) to a tool holder.

As described herein, a coating adhered to the substrate comprises a refractory layer deposited by PVD. The PVD refractory layer comprises a plurality of sublayer groups, a sublayer group comprising a titanium aluminum nitride sublayer and an adjacent composite sublayer comprising alternating nanolayers of titanium silicon nitride and titanium aluminum nitride. In some embodiments, the titanium aluminum nitride sublayer is of the formula $Ti_{1-x}Al_xN$, wherein $x \geq 0.68$. In some embodiments, x of the $Ti_{1-x}Al_xN$ sublayer has a value selected from Table I.

TABLE I

| Al Content of $Ti_{1-x}Al_xN$ Sublayer (at. %) Value of x in $Ti_{1-x}Al_xN$ |
|---|
| ≥0.69 |
| ≥0.7 |
| ≥0.75 |
| ≥0.8 |
| 0.68-0.9 |
| 0.7-0.9 |
| 0.72-0.9 |
| 0.75-0.9 |
| 0.8-0.9 |

Sublayers of titanium aluminum nitride can generally have uniform aluminum content between sublayer groups. Alternatively, aluminum content of titanium aluminum nitride sublayers can vary between sublayer groups. For example, aluminum content of titanium aluminum nitride sublayers can vary periodically or aperiodically over the thickness of the refractory layer. In some embodiments, aluminum content increases in titanium aluminum nitride sublayers in a direction proceeding away from the substrate. In other embodiments, aluminum content decreases in titanium aluminum nitride sublayers in a direction proceeding away from the substrate.

Thickness of a titanium aluminum nitride sublayer can be selected according to several considerations including, but not limited to, the overall desired thickness of the refractory layer, the number of sublayer groups and thickness of the adjacent composite sublayer comprising alternating nanolayers of titanium silicon nitride and titanium aluminum nitride. In some embodiments, a sublayer of titanium aluminum nitride has thickness less than 100 nm. A titanium aluminum nitride sublayer of a sublayer group can also have thickness selected from Table II.

TABLE II

| Titanium Aluminum Nitride Sublayer Thickness (nm) |
|---|
| 5-100 |
| 10-100 |
| 20-100 |
| 20-90 |
| 20-60 |

Sublayers of titanium aluminum nitride can generally have uniform thickness between sublayer groups. Alternatively, thicknesses of titanium aluminum nitride sublayers can vary between sublayer groups. For example, thickness of titanium aluminum nitride sublayers can vary periodically or aperiodically over the thickness of the refractory layer. In some embodiments, titanium aluminum nitride sublayer thickness increases in a direction proceeding away from the substrate. In other embodiments, titanium aluminum nitride sublayer thickness decreases in a direction proceeding away from the substrate.

A sublayer group also comprises a composite sublayer adjacent to the titanium aluminum nitride sublayer. The composite sublayer comprises alternating nanolayers of titanium silicon nitride (TiSiN) and titanium aluminum nitride. In some embodiments, titanium silicon nitride is of the formula $Ti_{1-p}Si_pN$ wherein $0.05 \leq p \leq 0.3$. In some embodiments, p of a $Ti_{1-p}Si_pN$ nanolayer has a value selected from Table III.

TABLE III

| Si Content of $Ti_{1-p}Si_pN$ Nanolayer (at. %) Value of p in $Ti_{1-p}Si_pN$ |
|---|
| 0.05-0.25 |
| 0.05-0.20 |
| 0.05-0.15 |
| 0.1-0.2 |
| 0.1-0.15 |

Nanolayers of TiSiN can generally have uniform silicon content between sublayer groups or within a sublayer group. Alternatively, silicon content of TiSiN nanolayers can vary between sublayer groups or within a sublayer group. For example, silicon content of TiSiN nanolayers can vary periodically or aperiodically over the thickness of the refractory layer. In some embodiments, silicon content increases in TiSiN nanolayers in a direction proceeding away from the substrate. In other embodiments, silicon content decreases in TiSiN nanolayers in a direction proceeding away from the substrate.

Thickness of TiSiN nanolayers of a sublayer group can be selected according to several considerations including, but not limited to, the number of TiSiN nanolayers of a single sublayer group, the thickness and/or number of alternating titanium aluminum nitride nanolayers, the overall desired thickness of the refractory layer and the thickness of the adjacent titanium aluminum nitride sublayer. In some embodiments, a TiSiN nanolayer has thickness less than 10 nm. For example, TiSiN nanolayer can have thickness of 1-7 nm, 1-5 nm or 1-3 nm.

A composite sublayer also comprises titanium aluminum nitride sublayers alternating with the TiSiN sublayers. In some embodiments, the titanium aluminum nitride sublayers are of the formula $Ti_{1-y}Al_yN$, wherein $x \geq 0.68$. In some embodiments, y of the $Ti_{1-y}Al_yN$ sublayer has a value selected from Table I above. Nanolayers of titanium aluminum nitride can generally have uniform aluminum content between sublayer groups or within a sublayer group. Alternatively, aluminum content of titanium aluminum nitride nanolayers can vary between sublayer groups or within a sublayer group. For example, aluminum content of titanium aluminum nitride nanolayers can vary periodically or aperiodically over the thickness of the refractory layer. In some embodiments, aluminum content increases in titanium aluminum nitride nanolayers in a direction proceeding away from the substrate. In other embodiments, aluminum content decreases in titanium aluminum nitride nanolayers in a direction proceeding away from the substrate.

Thickness of titanium aluminum nitride nanolayers of a sublayer group can be selected according to several considerations including, but not limited to, the number of titanium aluminum nitride nanolayers of a single sublayer group, the thickness and/or number of alternating TiSiN nanolayers, the overall desired thickness of the refractory layer and the thickness of the adjacent titanium aluminum nitride sublayer. In some embodiments, a titanium aluminum nitride nanolayer has thickness less than 10 nm. For example, titanium aluminum nitride nanolayers can have thickness of 1-7 nm, 1-5 nm or 1-3 nm.

A composite sublayer group can comprise any desired number of alternating nanolayers of TiSiN and titanium aluminum nitride. In some embodiments, a composite sublayer comprises up to 30 or up to 20 combined nanolayers of TiSiN and titanium aluminum nitride. Thickness of a composite sublayer is dependent on the number of alternating TiSiN and titanium aluminum nitride nanolayers forming the composite sublayer layer. In some embodiments, composite sublayer thickness has a value selected from Table II hereinabove. Additionally, a thickness ratio between a composite sublayer and adjacent sublayer of titanium aluminum nitride (e.g. $Ti_{1-x}Al_xN$ sublayer), in some embodiments, ranges from 0.5 to 5. In some embodiments, the thickness ratio between a composite sublayer and adjacent titanium aluminum nitride sublayer ranges from 1.5 to 5 or from 2 to 4.

Moreover, composite sublayer thickness can be generally uniform throughout the refractory layer. Alternatively, composite sublayer thickness can vary between sublayer groups. For example, composite sublayer thickness can vary periodically or aperiodically over the thickness of the refractory layer. In some embodiments, composite sublayer thickness increases in a direction proceeding away from the substrate. In other embodiments, composite sublayer thickness decreases in a direction proceeding away from the substrate.

Any number of sublayer groups can be deposited by PVD to provide a refractory layer of desired thickness. In some embodiments, a refractory comprising the sublayer groups has thickness less than 1 μm. A refractory layer comprising the sublayer groups can also have thickness selected from Table IV.

TABLE IV

| PVD Refractory Layer Thickness (μm) |
| --- |
| 0.1-1 |
| 0.2-0.8 |
| 0.1-0.6 |
| ≤0.5 |
| 0.1-0.5 |

As described herein, titanium aluminum nitride in the refractory layer can have high aluminum content. $Ti_{1-x}Al_xN$ sublayers and $Ti_{1-y}Al_yN$ nanolayers of composite layer sublayers can exhibit aluminum contents wherein each of x and y are in excess of 0.68. In some embodiments, each of x and y have a value selected from Table I above. In such embodiments of high aluminum content, the PVD refractory layer can exhibit less than 35 weight percent hexagonal phase. In some embodiments, the PVD refractory layer can exhibit hexagonal phase having a value selected from Table V.

TABLE V

| Hexagonal Phase Content of Refractory Layer Refractory Layer Hexagonal Phase (wt. %) |
| --- |
| 0-35 |
| 3-30 |
| 20-35 |
| 25-35 |
| 20-30 |
| 1-10 |
| 1-5 |

In some embodiments, the PVD refractory layer does not comprise any hexagonal phase. Moreover, the PVD refractory layer may also comprise one or more silicon nitride phases, such as $Si_3N_4$. In some embodiments, the PVD refractory layer comprises amorphous phase in addition to TiSiN and/or titanium aluminum nitride phases.

Phase determination, including hexagonal phase determination, of refractory coatings described herein is determined using x-ray diffraction (XRD) techniques and the Rietveld refinement method, which is a full fit method. The measured specimen profile and a calculated profile are compared. By variation of several parameters known to one of skill in the art, the difference between the two profiles is minimized. All phases present in a coating layer under analysis are accounted for in order to conduct a proper Rietveld refinement.

A cutting tool comprising a coating including a PVD refractory layer described herein can be analyzed according to XRD using a grazing incidence technique requiring a flat surface. The cutting tool rake face or flank face can be analyzed depending on cutting tool geometry. XRD analysis of coatings described herein can be completed using a parallel beam optics system fitted with a copper x-ray tube. The operating parameters are 45 KV and 40 MA. Typical optics for grazing incidence analysis include an x-ray mirror with 1/16 degree antiscatter slit and a 0.04 radian soller slit. Receiving optics include a flat graphite monochromator, parallel plate collimator and a sealed proportional counter. X-ray diffraction data is collected at a grazing incidence angle selected to maximize coating peak intensity and eliminate interference peaks from the substrate. Counting times and scan rate are selected to provide optimal data for the Rietveld analysis. Prior to collection of the grazing incidence data, the specimen height is set using x-ray beam splitting.

A background profile is fitted and peak search is performed on the specimen data to identify all peak positions and peak intensities. The peak position and intensity data is used to identify the crystal phase composition of the specimen coating using any of the commercially available crystal phase databases.

Crystal structure data was input for each of the crystalline phases present in the specimen.

Typical Rietveld refinement parameters settings are:

Background calculation method: Polynomial

Sample Geometry: Flat Plate

Linear Absorption Coefficient: Calculated from average specimen composition

Weighting Scheme: Against Iobs

Profile Function: Pseudo-Voigt

Profile Base Width: Chosen per specimen

Least Squares Type: Newton-Raphson

Polarization Coefficient: 1.0

The Rietveld refinement typically includes:
  Specimen Displacement: shift of specimen from x-ray alignment
  Background profile selected to best describe the background profile of the diffraction data
  Scale Function: scale function of each phase
  B overall: displacement parameter applied to all atoms in phase
  Cell parameters: a, b, c and alpha, beta, and gamma
  W parameter: describes peak FWHM
  Any additional parameter to achieve an acceptable "Weighted R Profile"
All Rietveld phase analysis results are reported in weight percent values.

The PVD refractory layer comprising sublayer groups described herein can have hardness of at least 22 GPa. Hardness values are determined according to ISO 14577 with a Vickers indenter at an indentation depth of 0.25 μm. In some embodiments, a PVD refractory layer having a construction described herein, has hardness according to Table VI.

TABLE VI

| PVD Refractory Layer Hardness (GPa) |
| --- |
| ≥25 |
| ≥27 |
| ≥28 |
| 25-35 |
| 25-30 |
| 27-35 |
| 28-35 |
| 30-35 |

Figure 2:
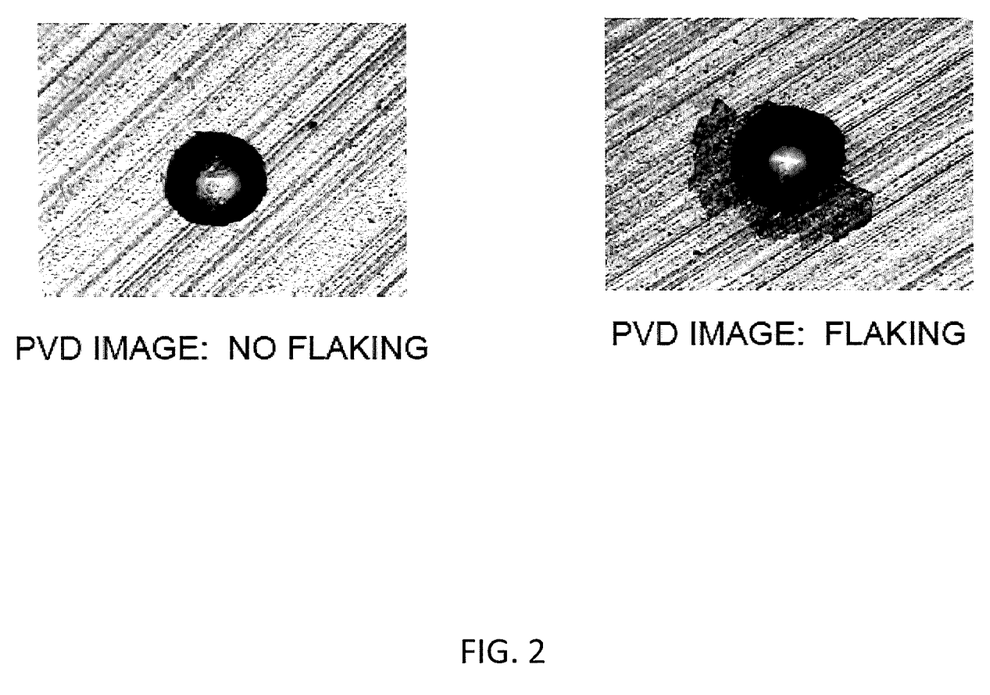
FIG. 2 illustrates non-limiting reference examples of PVD coating flaking for determining critical load ($L_c$) according to embodiments described herein.

In addition to hardness, a PVD refractory layer comprising sublayer groups described herein can demonstrate a critical load ($L_c$) of at least 60 kgf. Critical load characterizing adhesion of the refractory layer is determined according to the following protocol. A Rockwell Hardness Tester with superficial scales is employed having a Rockwell A or C brale indenter that is free of cracks, chip, flaws and adherent surface debris. Also employed are a spot anvil (0.25 inch diameter) and flat anvil (2 inch diameter). The appropriate pre-load (10 kg) for the indenter load being applied is selected. A flat surface of the coated substrate is selected and position on the anvil below the brale indenter and elevating screw is adjusted to the required zero scale position. Indentation(s) are applied at the desired superficial load (e.g. 60, 100, 150 kgf, etc.). The elevating screw is released and the sample is laterally positioned for application of the next load. Indents are spaced to avoid interference effects or contributions from neighboring indentations. The recommended spacing distance is 3-5× the diameter of the indentation. Any debonded but still adherent refractory layer can be removed by immersing the sample in an ultrasonic bath for several minutes. Alternatively, an adhesive tape can be used to remove debonded refractory layer. The indented samples are examined for flaking and delamination along the surface perimeter of the indent under optical microscope (10×-100×). Critical load ($L_c$) is reported at the load where coating flaking and/or delamination occur beyond the diameter of the indent. FIG. 2 illustrates non-limiting reference examples of flaking of a PVD coating under the present adhesion test. A refractory layer comprising sublayer groups described herein, in some embodiments, exhibits an $L_c$ selected from Table VII.

TABLE VII

| Critical Load ($L_c$) of $M_{1-x}Al_xN$ Refractory Layer |
| --- |
| ≥60 kgf |
| ≥100 kgf |
| ≥150 kgf |

The coating adhered to the substrate, in some embodiments, further comprises one or more intermediate layers between the PVD refractory layer and the substrate. An intermediate layer, for example, can comprise titanium aluminum nitride. Titanium aluminum nitride of the intermediate layer, for example, can be of the formula $Ti_{1-z}Al_zN$, wherein z≥0.68. In some embodiments, z has a value selected from Table I above. In other embodiments, z can be less than 0.68. An intermediate $Ti_{1-z}Al_zN$ layer, in some embodiments, has less than 5 weight percent hexagonal phase. An intermediate $Ti_{1-z}Al_zN$ layer, for example, can be free of hexagonal phase.

The PVD refractory layer comprising sublayer groups can be deposited directly on an intermediate layer comprising $Ti_{1-z}Al_zN$, in some embodiments. Alternatively, one or more intermediate layers having differing composition can be deposited between the $Ti_{1-z}Al_zN$ layer and PVD refractory layer comprising a plurality of subgroup layers described herein. Intermediate layer(s) can be deposited by PVD and/or chemical vapor deposition (CVD). An intermediate $Ti_{1-z}Al_zN$ layer can have any desired thickness. In some embodiments, an intermediate $Ti_{1-z}Al_zN$ layer has thickness of 0.5 μm to 2 μm. In other embodiments, an intermediate $Ti_{1-z}Al_zN$ I layer can have thickness of 2 μm to 10 μm. An intermediate $Ti_{1-z}Al_zN$ layer can also exhibit hardness having a value selected from Table V hereinabove.

Figure 3:
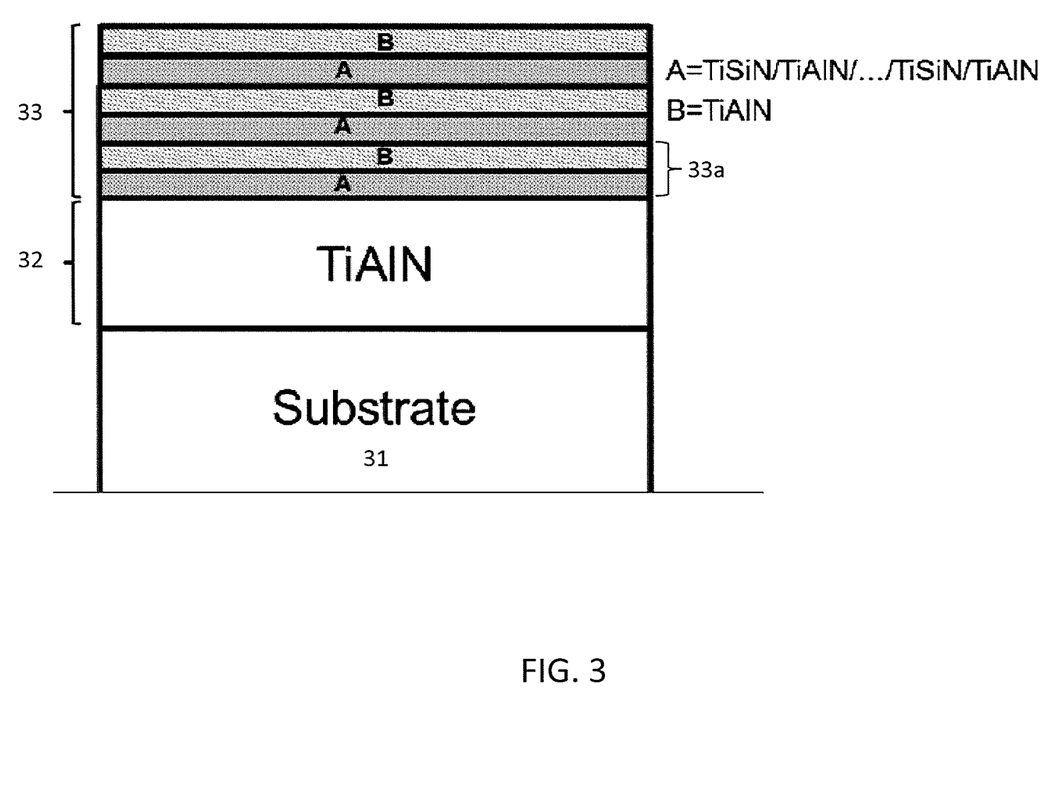
FIG. 3 is a cross-sectional schematic of a coated cutting tool according to some embodiments.

FIG. 3 is a cross-sectional schematic of a coated cutting tool according to some embodiments. As illustrated in FIG. 3, the coated cutting tool 30 comprises a substrate 31 and an intermediate TiAlN layer 32. In the embodiment of FIG. 3, the intermediate TiAlN layer 32 is adhered directly to the substrate 31. In other embodiments, one or more inner layers can be positioned between the intermediate TiAlN layer 32 and the substrate 31. A PVD refractory layer 33 comprising a plurality of sublayer groups 33a is adhered to the intermediate TiAlN layer 32. A sublayer group 33a comprises a titanium aluminum nitride sublayer (B) and adjacent composite sublayer (A) comprising alternating nanolayers of TiSiN and TiAlN.

As described in relation to FIG. 3, a coating described herein can further comprise one or more inner layers between the intermediate $Ti_{1-z}Al_zN$ layer and substrate. Inner layer(s) of the coating can comprise one or more metallic elements selected from the group consisting of aluminum and metallic elements of Groups IVB, VB and VIB of the Periodic Table and one or more non-metallic elements selected from the group consisting of nonmetallic elements of Groups IIIA, IVA, VA and VIA of the Periodic Table. For example, in some embodiments, one or more inner layers of TiN, TiC, TiCN or $Al_2O_3$ can be positioned between the cutting tool substrate and the intermediate $Ti_{1-z}Al_zN$ layer. Inner layer(s) can have any desired thickness not inconsistent with the objectives of the present invention. In some embodiments, an inner layer has a thickness in the range of 100 nm to 5 μm.

Moreover, the coating can further comprise one or more outer layers over the PVD refractory layer comprising the plurality of sublayer groups described herein. Outer refractory layer(s) of the coating can comprise one or more metallic elements selected from the group consisting of aluminum and metallic elements of Groups IVB, VB and VIB of the Periodic Table and one or more non-metallic elements selected from the group consisting of nonmetallic elements of Groups IIIA, IVA, VA and VIA of the Periodic Table. For example, in some embodiments, one or more outer refractory layers of TiN, AlTiN, TiC, TiCN or $Al_2O_3$ can be positioned over the refractory layer formed of the sublayer groups. Outer refractory layer(s) can have any desired thickness not inconsistent with the objectives of the present invention. In some embodiments, an outer refractory layer has a thickness in the range of 100 nm to 5 μm. Alternatively, the PVD refractory layer comprising the sublayer groups can be the outermost layer of the coating.

The sublayers forming the refractory layer can be deposited by any physical vapor deposition technique, including cathodic arc deposition or magnetron sputtering. Bias voltages employed during cathodic arc deposition of the sublayer groups can generally range from −40 V to −210 V. Additionally, bias voltage can vary between sublayer depositions. In some embodiments, titanium aluminum nitride sublayers and titanium aluminum nitride nanolayers of adjacent composite sublayers are deposited from the same cathode(s). In such embodiments, titanium aluminum nitride composition can be uniform over the thickness of the refractory layer. Alternatively, compositional variation can be established between sublayers and/or within sublayers by control of deposition process parameters and/or by deposition from different cathode compositions.

In some embodiments, one or more intermediate $Ti_{1-z}Al_zN$ layers are also deposited by cathodic arc deposition. An intermediate $Ti_{1-z}Al_zN$ layer may be deposited with the same cathode(s) employed in deposition of titanium aluminum nitride of the refractory layer. Additionally, bias voltages can generally range from −20 V to −100 V. In some embodiments, bias voltage is increased or decreased during deposition of an intermediate $Ti_{1-z}Al_zN$ layer.

These and other embodiments are further illustrated in the following non-limiting examples.

EXAMPLE 1—COATED CUTTING TOOL

A cutting tool was coated with a refractory layer formed of a plurality of sublayer groups, a sublayer group comprising a $Ti_{1-x}Al_xN$ sublayer and an adjacent composite sublayer comprising alternating nanolayers of TiSiN and $Ti_{1-y}Al_yN$, wherein x and y≥0.68. An intermediate layer of $Ti_{1-z}Al_zN$ (z≥0.68) was employed between the substrate and the refractory layer comprising the sublayer groups. The coating was deposited by cathodic arc evaporation on a cemented carbide (WC-6 wt. % Co) indexable insert substrate [ANSI standard geometry CNGG432FS] according to the parameters in Table VIII.

TABLE VIII

Cathodic Arc Coating Deposition Parameters

| Layer | Step | Target | Duration | Bias | Temperature | Pressure | Thickness |
|---|---|---|---|---|---|---|---|
| TiAlN | 1 | $Al_{0.71}Ti_{0.29}$ | 42 min | 40 V | 530° C. | $3.5*10^{-2}$ mbar | 1.5 μm |
| Base layer | 2 | | 84 min | 80 V | | | |
| Top layer | 3 | $Ti_{0.85}Si_{0.15}$ $Al_{0.71}Ti_{0.29}$ | 5 min | 120 V | 450° C. | $5*10^{-2}$ mbar | ~64 nm |
| | 4 | $Al_{0.71}Ti_{0.29}$ | 5 min | 120 V | | | ~36 nm |
| | 5 | $Ti_{0.85}Si_{0.15}$ $Al_{0.71}Ti_{0.29}$ | 5 min | 160 V | | | ~64 nm |
| | 6 | $Al_{0.71}Ti_{0.29}$ | 5 min | 160 V | | | ~36 nm |
| | 7 | $Ti_{0.85}Si_{0.15}$ $Al_{0.71}Ti_{0.29}$ | 5 min | 210 V | | | ~64 nm |
| | 8 | $Al_{0.71}Ti_{0.29}$ | 5 min | 210 V | | | ~36 nm |

Properties of the resulting coating are provided in Table IX. Hexagonal phase content and hardness of the top refractory layer were determined according to their respective techniques described in herein.

TABLE IX

Refractory Layer Properties

| Example | Hardness (GPa) | Hexagonal Phase (wt. %) | Coating Thickness (μm) |
|---|---|---|---|
| 1 | 30.2 | 0 | 1.8 |

EXAMPLE 2—METAL CUTTING TESTING

Coated cutting inserts (1) having the architecture of Example 1 were subjected to cutting lifetime testing relative to comparative coated cutting inserts (2-4). Comparative coated cutting inserts (2-4) exhibited compositional properties in Table X. The coatings listed in Table X were deposited by cathodic arc deposition.

TABLE X

Comparative Coated Cutting Inserts

| Coated Cutting Insert | Substrate | First Layer | Second Layer |
|---|---|---|---|
| 2 | WC-Co (6 wt. %) CNMG432.xx | TiAlN (1.1 μm) | TiAlSiN (3.5 μm) |
| 3 | WC-Co (6 wt. %) CNGG432FS | $Ti_{0.39}Al_{0.61}N$ (3 μm) | None |
| 4 | WC-Co (6 wt. %) CNGG432FS | $Ti_{0.39}Al_{0.61}N$ (2.1 μm) | None |

Coated cutting inserts 1-4 were subjected to cutting lifetime testing in an Inconel 718 continuous turning test. The cutting conditions were as follows:

Cutting Speed: 300 sfm

Feed per Revolution: 0.006 ipr

Axial Depth of Cut: 0.01 inches

Coolant: Flood

Tool life criteria are provided in Table XI.

TABLE XI

| Tool life criteria (inch) | |
|---|---|
| Uniform Wear | 0.006 |
| Max Wear | 0.006 |
| Nose Wear | 0.006 |
| Depth of Cut Notch | 0.006 |
| Trailing Edge | 0.006 |

A total of 4 replications were conducted for each cutting insert. Average cutting lifetimes are provided in Table XII.

TABLE XII

| Coated Cutting Tool Lifetimes (minutes) | |
|---|---|
| Coated Cutting Insert | Average Lifetime |
| 1 | 13.8 |
| 2 | 2.2 |
| 3 | 2.0 |
| 4 | 5.7 |

As provided in Table XII, cutting tools having coating architectures of Example 1 herein exhibited substantial increases in cutting lifetime relative to the comparative cutting inserts.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A coated cutting tool comprising:
a substrate; and
a refractory layer deposited by physical vapor deposition adhered to the substrate, the refractory layer comprising a plurality of sublayer groups, a sublayer group comprising a titanium aluminum nitride sublayer and an adjacent composite sublayer comprising alternating nanolayers titanium silicon nitride and titanium aluminum nitride, wherein the refractory layer has a critical load ($L_c$) of at least 100 kg.

2. The coated cutting tool of claim 1, wherein $0.7 \leq x \leq 0.9$.

3. The coated cutting tool of claim 1, wherein the titanium aluminum nitride nanolayers are of the formula $Ti_{1-y}Al_yN$, wherein $y \geq 0.68$.

4. The coated cutting tool of claim 3, wherein $y \geq 0.69$.

5. The coated cutting tool of claim 3, wherein $0.7 \leq y \leq 0.9$.

6. The coated cutting tool of claim 1, wherein the refractory layer has hardness of at least 22 GPa.

7. The coated cutting tool of claim 1, wherein the refractory layer has hardness of 25 to 35 GPa.

8. The coated cutting tool of claim 1, wherein the refractory layer has less than 35 weight percent hexagonal phase.

9. The coated cutting tool of claim 1, wherein the refractory layer has less than 5 weight percent hexagonal phase.

10. The coated cutting tool of claim 1, wherein the refractory layer is free of hexagonal phase.

11. The coated cutting tool of claim 1, wherein the titanium silicon nitride nanolayers are of the formula $Ti_{1-p}Si_pN$ wherein $0.05 \leq p \leq 0.3$.

12. The coated cutting tool of claim 1, wherein the refractory layer has thickness of less than 1 µm.

* * * * *